(12) United States Patent
Park et al.

(10) Patent No.: US 6,487,113 B1
(45) Date of Patent: Nov. 26, 2002

(54) PROGRAMMING A PHASE-CHANGE MEMORY WITH SLOW QUENCH TIME

(75) Inventors: Eungjoon Park, Fremont, CA (US); Tyler A. Lowrey, San Jose, CA (US)

(73) Assignee: Ovonyx, Inc., Troy, MI (US)

( * ) Notice: Subject to any disclaimer, the term of this patent is extended or adjusted under 35 U.S.C. 154(b) by 0 days.

(21) Appl. No.: 09/895,054

(22) Filed: Jun. 29, 2001

(51) Int. Cl.⁷ .............................................. G11C 11/00
(52) U.S. Cl. ........................................ 365/163; 365/148
(58) Field of Search ................................ 365/100, 113, 365/148, 163

(56) References Cited

U.S. PATENT DOCUMENTS

| | | | |
|---|---|---|---|
| 3,271,591 A | | 9/1966 | Ovshinsky |
| 3,530,441 A | | 9/1970 | Ovshinsky |
| 5,912,839 A | * | 6/1999 | Ovshinsky et al. ......... 365/163 |
| 6,085,341 A | | 7/2000 | Greason et al. ............. 714/718 |
| 6,141,241 A | | 10/2000 | Ovshinsky et al. ......... 365/163 |
| 6,339,544 B1 | * | 1/2002 | Chiang et al. .............. 365/163 |

* cited by examiner

Primary Examiner—Son Mai
(74) Attorney, Agent, or Firm—Trop, Pruner & Hu, P.C.

(57) ABSTRACT

A memory array is operated by increasing a number of currents through a number of corresponding cells of the array, where each cell has a structural phase-change material to store data for that cell. Each of the currents are increased to an upper level that is sufficiently high that can cause the corresponding cell to be in a first state. Some of the currents are decreased to lower levels at sufficiently high rates that cause their corresponding cells to be programmed to the first state, while others are decreased at sufficiently low rates that cause their corresponding cells to be programmed to a second state.

17 Claims, 5 Drawing Sheets

INCREASING A NUMBER OF CURRENTS THROUGH A NUMBER OF CORRESPONDING CELLS (SUCH AS TWO OR MORE) OF THE MEMORY ARRAY, WHERE EACH CELL HAS A STRUCTURE PHASE-CHANGE MATERIAL TO STORE DATA FOR THAT CELL.
504

DECREASING SOME OF THE CURRENTS (AT LEAST ONE) TO LOWER LEVELS. THESE CURRENTS ARE DECREASED AT SUFFICIENTLY HIGH RATES THAT CAUSE THEIR CORRESPONDING CELLS TO REMAIN IN THE FIRST STATE.
508

SOME OTHERS (AT LEAST ONE) OF THE CURRENTS IN THE MEMORY ARRAY ARE ALSO DECREASED TO THE LOWER LEVELS, HOWEVER THESE OTHERS ARE DECREASED AT SUFFICIENTLY LOW RATES THAT CAUSE THEIR CORRESPONDING CELLS TO CHANGE TO THE SECOND STATE RATHER THAN REMAIN IN THE FIRST STATE.
512

FIG. 5

PROGRAMMING A PHASE-CHANGE MEMORY WITH SLOW QUENCH TIME

BACKGROUND

This invention is related to techniques for programming a structural phase-change material solid state memory device such as those that use a chalcogenide material which can be programmed into different resistivity states to store data.

Solid state memory devices that use a structural phase-change material as the data storage mechanism (referred to here simply as 'phase-change memories') offer significant advantages in both cost and performance over conventional charge storage based memories. The phase-change memory is made of an array of constituent cells where each cell has some structural phase-change material to store the cell's data. This material may be, for instance, a chalcogenide alloy that exhibits a reversible structural phase change from amorphous to crystalline. A small volume of the chalcogenide alloy is integrated into a circuit that allows the cell to act as a fast switching programmable resistor. This programmable resistor can exhibit greater than 40 times dynamic range of resistivity between a relatively crystalline phase (low resistivity) and a relatively amorphous phase (high resistivity). The data stored in the cell is read by measuring the cell's resistance. The chalcogenide alloy cell is also non-volatile.

A conventional technique for programming a phase-change memory cell is to apply a rectangular pulse of current (having a constant magnitude throughout the pulse) to the cell, at a voltage greater than a switching threshold for the phase-change material, which leaves the cell in the reset state (the material is relatively amorphous and has high resistivity). To change state, this may be followed by the application of a subsequent rectangular lower current pulse, also at a voltage greater than the switching threshold, which programs the cell to a set state (the material is relatively crystalline and has low resistivity). The reset pulse has a higher magnitude of current than the set pulse so that the temperature of the phase change material is raised to $T_m$, the amorphizing temperature, before the material is rapidly cooled down or quenched by the very sharp decrease in current at the trailing edge of the reset pulse, thereby leaving the material in the amorphous phase. To change into the crystalline phase, the material can be heated back up to an optimum temperature $T_{opt}$, which is lower than $T_m$, using a rectangular current pulse of smaller magnitude, and then rapidly cooled down again, this time leaving the material in the crystalline (low resistance) phase.

BRIEF DESCRIPTION OF THE DRAWINGS

FIG. 5 shows a flow diagram of a phase-change memory programming process.

DETAILED DESCRIPTION

According to an embodiment of the invention, the conventional rectangular reset pulses that are applied to some of the cells in the phase-change memory array are modified such that their currents decrease at sufficiently low rates, so as to program those cells to another state. For instance, the decay during the trailing portion of such pulses can be slow enough to ensure that the phase-change materials in those cells spend the minimum required time interval at a specified temperature, so as to program those cells to the relatively crystalline phase. Such a modified reset pulse, having slow quench time, may permit faster programming of the entire memory array as a separate set pulse is not needed.

Figure 1:
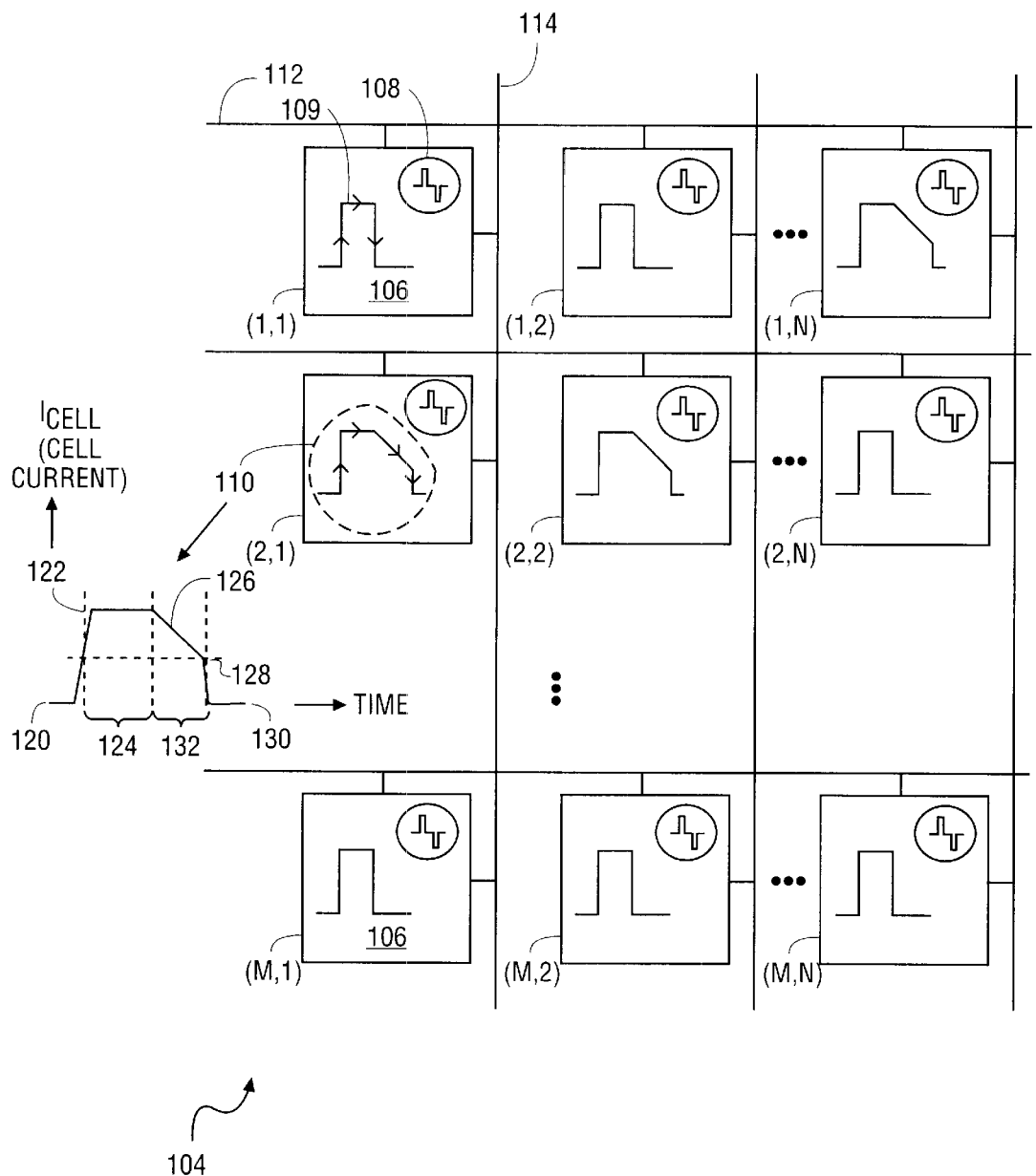
FIG. 1 illustrates a block diagram of part of a phase-change memory array featuring a cell current pulse having a slowly decaying trailing portion.

Referring to FIG. 1, what's shown is a block diagram of part of a phase-change memory array 104 featuring a cell current pulse 110 having a slowly decaying trailing portion. The array 104 has a number of phase-change memory cells 106 each of which has a structural phase-change material 108 to store data for that cell. Each cell may be accessed by a unique pair of bitlines 114 and wordlines 112 to apply the needed current pulses to each cell. The cells are arranged in a rectangular array in this embodiment, in which each cell 106 is given an index (i,j) where i=1 . . . N and j=1 . . . M.

Each cell 106 in the array 104 may be subjected to a current pulse 109 or 110. The current pulse 109 is rectangular, with rapid increasing and decreasing leading and trailing edges, respectively, as shown. The current pulse 109 has a rapidly increasing leading portion followed by a plateau of a given level for a given time interval, and then followed by a rapidly decreasing trailing portion. The current is decreased in the trailing portion at a sufficiently high rate that causes the material 118 in the corresponding cell 106 to be quickly quenched and thereby cause the cell to be programmed to a reset state. The current pulse 109 may thus be an entirely conventional reset pulse.

FIG. 1 also illustrates that some of the cells 106 in the array 104 are subjected to a different current pulse 110, where this pulse results in a slow quench time for the phase-change material 108 in the corresponding cell 106. One or more of the cells 106, such as the one with index (2,1), may be subjected to this current pulse 110, at the same time. As shown in FIG. 1, the current pulse 110 begins with a relatively low level 120 and rapidly rises to an upper level 122. This rise may be effectuated by, for instance, the closing of a solid state switch which causes a rapid rise, or it may be implemented in a more controlled manner to rise more slowly. For faster programming, the rapid rise may be more desirable. This leading portion may be essentially identical to that of the conventional current pulse 109 that is applied to the cell 106 having index (1,1).

Once the cell current of the pulse 110 has been increased to the upper level 122, this upper level may be maintained for a predetermined time interval such as one that is sufficient to insure changing the material 108 into the relatively amorphous phase. This interval has the reference number 124 in FIG. 1. In the trailing portion of the pulse 110, the current starts to decrease slowly during an interval 132 towards a lower level 130. This decrease is at a sufficiently low rate as to cause the material 108 in the corresponding cell 106 to program to the relatively crystalline phase. In contrast, the rapid decrease in the trailing edge of the conventional current pulse 109 causes the material 108 in the cell 106 having index (1,1) to program to the amorphous phase.

The current need not be reduced all the way down to the lower level 130 during the interval 132, but rather may be decreased to an intermediate level 128 at the sufficiently low rate, prior to its rapid decrease down to the lower level 130 as shown in the figure. This may help shorten the total time interval of the pulse 110 in situations where the material 108 has reached its desired phase by the end of the interval 132.

In the embodiment of the pulse 110 shown in FIG. 1, the slope or decay rate 126 in the trailing portion is linear and as such may be entirely defined by specifying the upper level 122, the intermediate level 128, and the interval 132. In other embodiments, however, the decay rate 126 may be non linear for a variety of reasons, such as improved phase-change performance in the material 108 or lower cost of implementation using certain types of analog circuitry, as the case may be. In addition, the lower levels 120 and 130 may be the same and equal to essentially zero current, although different and/or nonzero levels may also be applicable so long as they ensure that the state of the memory cell 106 does not change at those lower levels and power consumption requirements are met. In the embodiments described above, the cell is allowed to exhibit at least two states, a first state in which the material 108 is relatively amorphous and a second state in which the material 108 is relatively crystalline. These two may correspond to the conventional reset and set states, respectively, associated with a phase-change memory cell that can store one bit.

Figure 2:
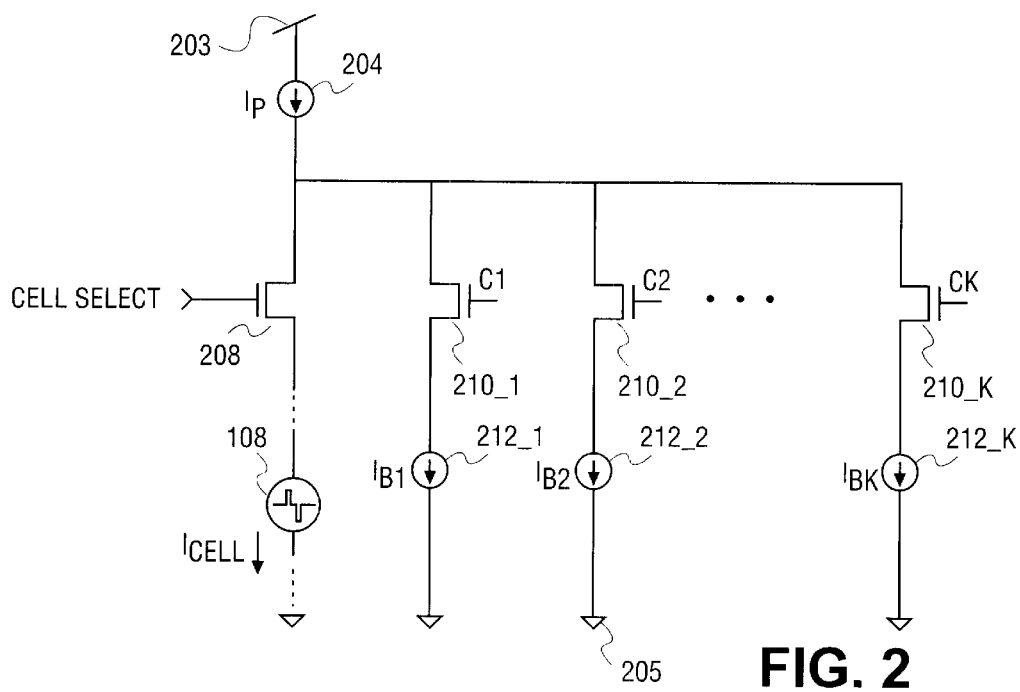
FIG. 2 depicts a circuit schematic of circuitry that may be used to generate the slowly decaying cell current pulse.
Figure 4:
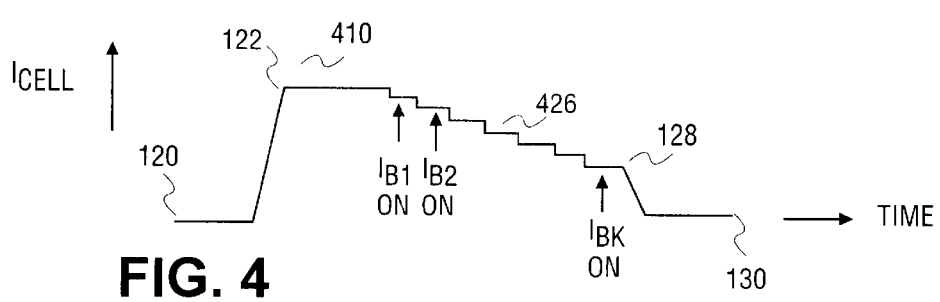
FIG. 4 illustrates a cell current pulse with a stepped, slowly decaying trailing portion obtained using the circuitry of FIG. 3.

Referring now to FIG. 2, what is shown is a circuit schematic of waveshaping circuitry that can be used to generate a slowly decaying cell current pulse 410 as shown in FIG. 4. This version of the circuitry is designed to cause a programming current $I_p$, enabled by current source 204 which is coupled to a supply node 203, to be selectively passed through a volume of phase-change material 108 of a given cell, using a switching transistor 208. The transistor 208 is under control of a cell select signal so that when the cell has been selected, the transistor is turned on thereby providing a low impedance path between the material 108 and the current source 204 which cause the current through the cell to increase rapidly to an upper level, such as $I_p$. In this embodiment, the cell current $I_{cell}$ happens to pass through the material 108 and is returned to the power supply via a return node 205 that may be at circuit ground/zero volts as illustrated.

The circuitry in FIG. 2 also has a number of current paths that are enabled by a number of switching transistors 210_1, 210_2, . . . 210_K, under control of signals C1, C2, . . . CK. Each of these current paths may be defined by current sources 212_1, 212_2, . . . 212_K. It can be seen that by sequentially enabling these current paths, i.e. by turning on transistors 210 one at a time, the cell current $I_{cell}$ is decreased as some of the programming current $I_p$, is progressively steered into the current paths. This in effect causes the cell current pulse 410 to be stepped downwards as shown in FIG. 4 with each subsequent turning on of a transistor 210, until the cell current has reached an intermediate level 128 as shown. Although the step sizes of the decay rate 426 are shown to be equal, unequal step sizes may alternatively be used, corresponding to unequal current sources $I_{B1}$, $I_{B2}$, . . .

Figure 3:
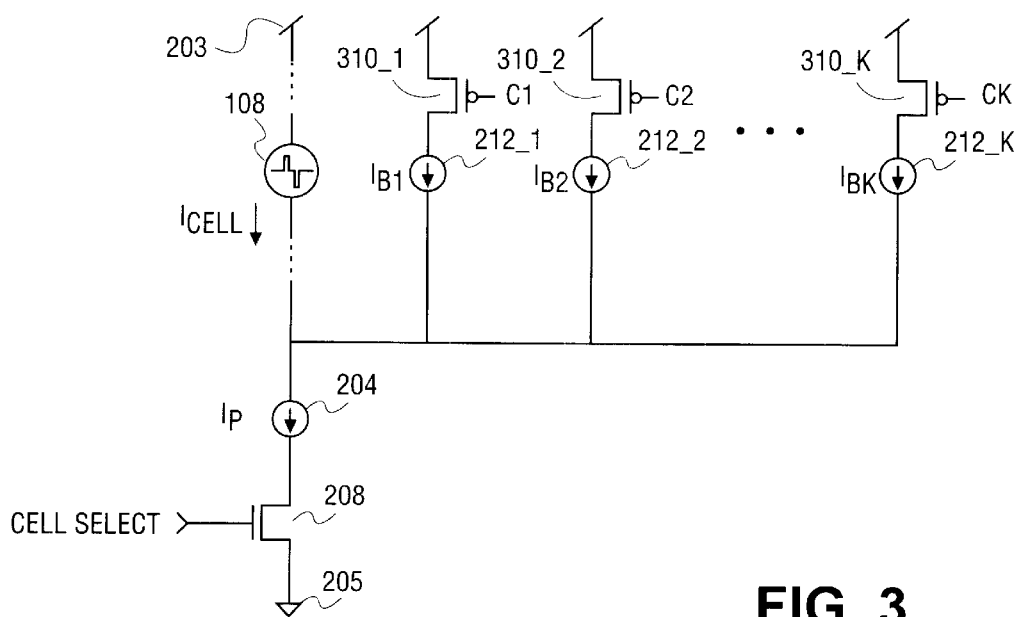
FIG. 3 depicts a circuit schematic of another embodiment of circuitry used to generate the slowly decaying cell current pulse.

FIG. 3 shows another version of the waveshaping circuitry that can create the profile of the cell current pulse 410 of FIG. 4. In this version, the available programming current $I_p$ is sunk from a node to which the phase-change material 108 is connected. Once again, the switching transistor 208 allows the cell to be selected and enables the available programming current $I_p$ through the material 108, while a number of bypass current paths are blocked via transistors 310_1, 310_2, . . . 310_K. These transistors are p-channel metal oxide semiconductor field effect transistors (MOSFETs) in contrast to n-channel transistors 210 in FIG. 2. Similar to the version in FIG. 2, the cell current in FIG. 3 can be progressively decreased by sequentially turning on transistors 310. In both versions of the circuitry shown in FIGS. 2 and 3, the control signals C1, C2, . . . CK and cell select may be digital so as to allow for digital control of the decay rate of the cell current in response to, for instance, a digital code that represents the desired decay rate. One of ordinary skill in the art based on this disclosure will be able to design the needed circuitry, in a wide range of different implementations, to achieve the proper timing of the assertion of the control signals so that the pulse 410 is generated with the desired levels.

Referring now to FIG. 5, a flow diagram of a phase-change memory programming process is depicted. This process essentially summarizes the technique described generally above in which operation 504 begins with increasing a number of currents through a number of corresponding cells (such as two or more) of the memory array, where each cell has a structural phase-change material to store data for that cell. Each of these currents is increased to an upper level that is sufficiently high to cause the corresponding cell to be in a first state. This first state may be the reset state in which the phase-change material is relatively amorphous and has relatively high resistivity. Next, operation 508 proceeds with decreasing some of the currents (at least one) to lower levels. These currents are decreased at sufficiently high rates that cause their corresponding cells to be programmed to the reset state. Some others (at least one) of the currents in the memory array are also decreased to the lower levels, however these others are decreased at sufficiently low rates that cause their corresponding cells to be programmed to the second state rather than programmed to the first state (operation 512). As mentioned above, this second state may be the set state in which the phase-change material is relatively crystalline and has relatively low resistance. The technique thus allows, for instance, two different pulses to be created where each has the same leading portion but different trailing portions. One of the pulses is conventional in that it has a rapidly decreasing trailing portion, whereas the other pulse is modified to have a slowly decaying trailing portion, where the latter pulse will set its cell and the former pulse will reset its cell.

Figure 6:
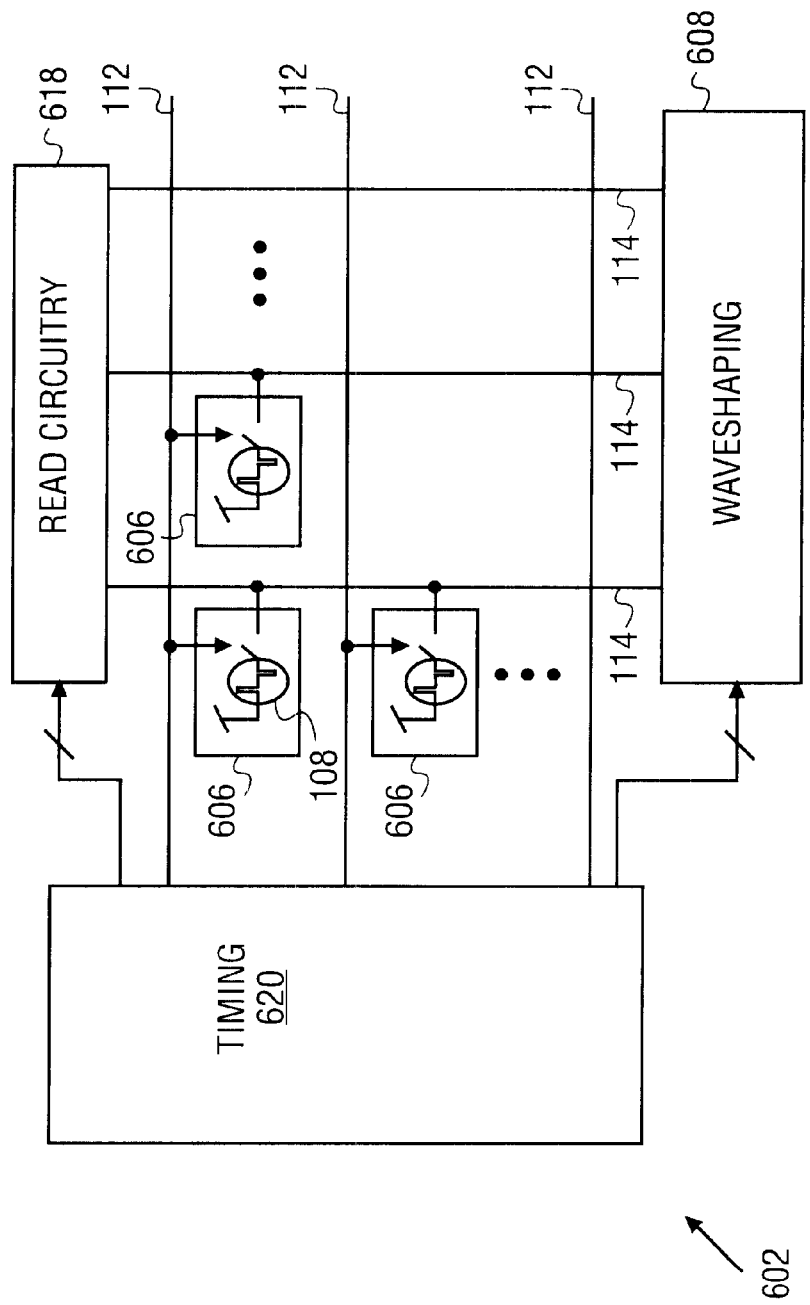
FIG. 6 illustrates a block diagram of an integrated circuit device having a phase-change material memory array, including waveshaping and driving circuitry that are designed to provide the voltage and current levels needed to program the constituent cells of the device.

Turning now to FIG. 6, what is shown is a block diagram of an integrated circuit phase-change material memory device 602, including waveshaping circuitry 608 that is designed to provide the voltage and current levels needed to program the constituent cells of the device according to some of the embodiments described above. The device features an array of memory cells 606 where each cell 606 can be accessed by a unique pair of vertical conductors 114 (bitlines) and horizontal conductors 112 (wordlines). In this embodiment, the horizontal conductors allow a control signal from timing logic 620 to be provided to each cell to close or open a solid state switch therein. This solid state switch is in series with a volume of the phase-change material 108 whose other terminal is connected to a power supply or power return node. Current is thus sourced or sunk, in this embodiment through the phase-change material 108, when the switch is closed. This cell current is provided only through the vertical conductors 114. In other embodiments (not shown), however, the cell current passes through both bitlines and wordlines. The sourcing or sinking of the cell current is performed by either the read circuitry 618 or waveshaping circuitry 608, depending upon whether a write or read operation is being performed. The read circuitry 618 may be entirely conventional and is not described any further here.

The waveshaping circuitry 608 may be designed according to the versions given in FIGS. 2 and 3 above, so as to provide the voltage and current levels that are needed to program the cells 606 according to the pulses 109 and 410 described above. Alternatively, the waveshaping circuitry can be implemented using conventional analog waveshaping circuits such as integrator/ramp circuits, exponential and logarithmic circuits, as well as others, to provide the non-stepped version of the cell current pulse 110 (see FIG. 1).

The timing associated with the generation of the pulses may be determined by timing logic 620. In the embodiment of FIG. 6, the timing logic 620 provides digital control signals to the waveshaping circuitry 608 and the read circuitry 618 so that the latter circuits either measure the resistance of the memory cell 606 (read operation) or provide the reset and set pulses at the correct timing and to the selected memory cell 606. Accesses to the cell 606 may be in random fashion where each cell can be accessed individually, or it may be orchestrated according to a row by row basis, depending upon the higher level requirements of the memory system.

The memory device depicted in FIG. 6 may be built using a wide range of different fabrication processes, including a slightly modified version of a conventional complimentary metal oxide semiconductor (CMOS) logic fabrication process. The array of cells 606 and the timing logic 620 and waveshaping circuitry 608 may be formed in the same integrated circuit (IC) die.

Figure 7:
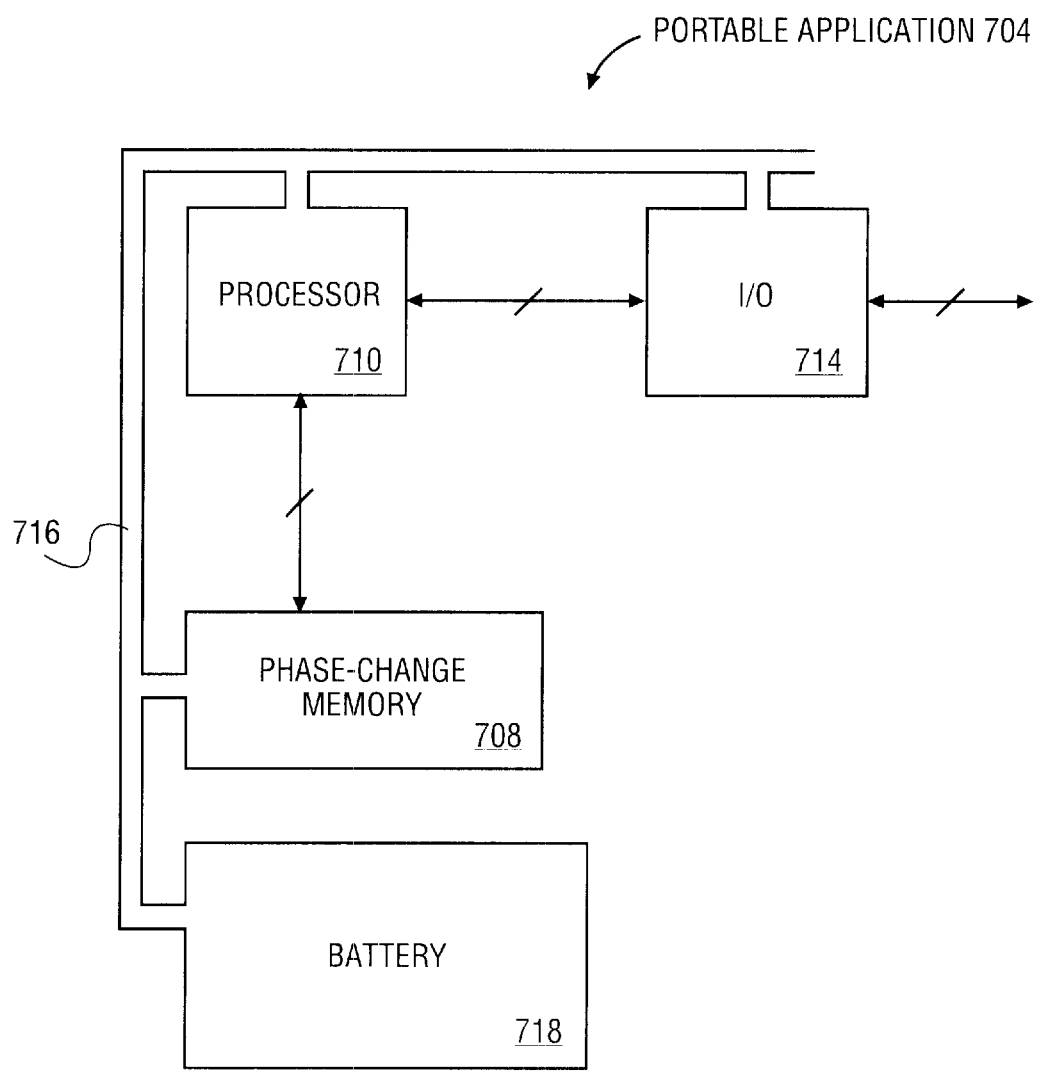
FIG. 7 depicts a block diagram of an embodiment of a portable application of a phase-change memory that incorporates the programming process.

FIG. 7 illustrates a block diagram of a portable application 704 of the phase-change memory programming process described above. A phase-change memory 708 is operated according to an embodiment of the programming process described above. The phase-change memory 708 may include one or more integrated circuit dies where each die has a memory array that is programmed according to the various embodiments of the programming techniques described above in FIGS. 1–6. These IC dies may be separate, stand alone memory devices that are arranged in modules such as conventional dynamic random access memory (DRAM) modules, or they may be integrated with other on-chip functionalities. In the latter embodiments, the phase-change memory 708 may be part of an I/O processor or a microcontroller.

The application 704 may be for instance a portable notebook computer, a digital still and/or video camera, a personal digital assistant, or a mobile (cellular) hand-held telephone unit. In all of these applications, an electronic system includes a processor 710 that uses the phase-change memory 708 as program memory to store code and data for its execution. Alternatively, the phase-change memory 708 may be used as a mass storage device for non-volatile storage of code and data. The portable application 704 communicates with other devices, such as a personal computer or a network of computers via an I/O interface 714. This I/O interface 714 may provide access to a computer peripheral bus, a high speed digital communication transmission line, or an antenna for unguided transmissions. Communications between the processor and the phase-change memory 708 and between the processor and the I/O interface 714 may be accomplished using conventional computer bus architectures.

The above-described components of the portable application 704 are powered by a battery 718 via a power supply bus 716. Since the application 704 is normally battery powered, its functional components including the phase-change memory 708 should be designed to provide the desired performance at low power consumption levels. In addition, due to the restricted size of portable applications, the various components shown in FIG. 7 including the phase-change memory 708 should provide a relatively high density of functionality. Of course, there are other non-portable applications for the phase-change memory 708 that are not shown. These include, for instance, large network servers or other computing devices which may benefit from a non-volatile memory device such as the phase-change memory.

As an example, the phase-change material may be $Ge_2Sb_2Te_5$. An exemplary pulse may have a peak current magnitude of Ireset, where Ireset is sufficiently high to allow the cells of the array to be programmed into the reset state. The exemplary pulse may also have a falling edge that decreases from Ireset to zero current in about 200 nsec. These specifics, however, are merely exemplary and the programming technique may work with a wide range of different phase-change materials and pulse shapes having relatively slow falling edges.

To summarize, various embodiments of a technique for programming a phase-change memory with slow quench time, have been described. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for operating a memory array, comprising:
   increasing a plurality of currents through a plurality of corresponding cells of the memory array, each cell having a structural phase-change material to store data for that cell, each of the plurality of currents being increased to an upper level that is sufficiently high that can cause the material in the corresponding cell to be in a first phase; and then
   decreasing some of the currents to lower levels, those currents being decreased at sufficiently high rates that cause the materials in their corresponding cells to be programmed to the first phase; and
   decreasing some others of the currents to lower levels, those others being decreased at sufficiently low rates that cause the materials in their corresponding cells to be programmed to a second phase.

2. The method of claim 1 further comprising:
   after having increased the plurality of currents through the plurality of cells, maintaining the currents relatively constant at said upper levels for a predetermined time interval, prior to decreasing the currents.

3. The method of claim 2 wherein those others of the currents are decreased to intermediate levels at the sufficiently low rates, and then to the lower levels at relatively high rates.

4. The method of claim 3 wherein the lower levels are equal to essentially zero current.

5. The method of claim 1 wherein the first phase is relatively amorphous and the second phase is relatively crystalline.

6. The method of claim 1 wherein each of those others of the currents is decreased by sequentially enabling a plurality of current paths to progressively steer some of each into the current paths.

7. The method of claim 6 wherein the first phase is relatively amorphous and the second phase is relatively crystalline.

8. An integrated circuit device comprising:
a memory array having a plurality of cells, each cell having a structural phase-change material to store data for that cell; and
waveshaping and timing logic circuitry coupled to the memory array to (1) increase a plurality of currents through a plurality of corresponding cells of the array, each of the plurality of currents to be increased to an upper level that is sufficiently high that can cause the material in the corresponding cell to be in a first phase, and then (2) decrease some of the currents to lower levels, those currents to be decreased at sufficiently high rates that cause the materials in their corresponding cells to be programmed to the first phase, and (3) decrease some others of the currents to lower levels, those others to be decreased at sufficiently low rates that cause the materials in their corresponding cells to be programmed to a second phase.

9. The integrated circuit of claim 8 wherein the waveshaping and timing logic circuitry is to, after having increased the plurality of currents through the plurality of cells, maintain the currents relatively constant at said upper levels for a predetermined time interval, prior to decreasing the currents.

10. The integrated circuit of claim 9 wherein the waveshaping and timing logic circuitry is to decrease those others of the currents to intermediate levels at the sufficiently low rates, and then to the lower levels at relatively high rates.

11. The integrated circuit of claim 10 wherein the lower levels are equal to essentially zero current.

12. The integrated circuit of claim 8 wherein the waveshaping and timing logic circuitry is to decrease each of those others of the currents by sequentially enabling a plurality of current paths to progressively steer some of each into the current paths.

13. The integrated circuit of claim 12 wherein the first phase is relatively amorphous and the second phase is relatively crystalline.

14. The integrated circuit of claim 8 wherein the first phase is relatively amorphous and the second phase is relatively crystalline.

15. An integrated circuit device comprising:
means for storing data according to a first state and a second state;
means for increasing a current through the storage means to an upper level that is sufficiently high that can cause the storage means to be in the first state, wherein the storage means programs to the first state if the current is decreased from the upper level to a lower level at a sufficiently high rate; and
means for decreasing the current from the upper level to the lower level at a sufficiently low rate that can cause the storage means to be programmed to the second state.

16. The integrated circuit device of claim 15 further comprising:
means for maintaining the current relatively constant at the upper level for a predetermined time interval prior to decreasing the current at the sufficiently low rate.

17. The integrated circuit device of claim 16 wherein the decreasing
means is to decrease the current from the upper level to an intermediate level at the sufficiently low rate, and then to the lower level at a relatively high rate.

* * * * *